(12) United States Patent
Kurumado

(10) Patent No.: US 9,062,955 B2
(45) Date of Patent: Jun. 23, 2015

(54) MOVING OBJECT DETECTION APPARATUS

(75) Inventor: Norihiro Kurumado, Nagoya (JP)

(73) Assignee: DENSO CORPORATION, Kariya (JP)

( * ) Notice: Subject to any disclaimer, the term of this patent is extended or adjusted under 35 U.S.C. 154(b) by 21 days.

(21) Appl. No.: 14/124,803

(22) PCT Filed: Jul. 2, 2012

(86) PCT No.: PCT/JP2012/004265
§ 371 (c)(1),
(2), (4) Date: Dec. 9, 2013

(87) PCT Pub. No.: WO2013/005410
PCT Pub. Date: Jan. 10, 2013

(65) Prior Publication Data
US 2014/0117981 A1    May 1, 2014

(30) Foreign Application Priority Data

Jul. 5, 2011    (JP) ................. 2011-149212

(51) Int. Cl.
*G01R 33/09* (2006.01)
*H01L 43/08* (2006.01)
(Continued)

(52) U.S. Cl.
CPC ............... *G01B 7/003* (2013.01); *G01D 5/145* (2013.01); *H03K 17/9517* (2013.01); *H03K 2217/94068* (2013.01)

(58) Field of Classification Search
CPC .......... G01B 7/003; G01P 3/46; G01D 5/145; G01D 5/16
USPC ................. 324/207.21, 207.25, 173
See application file for complete search history.

(56) References Cited

U.S. PATENT DOCUMENTS 5,500,585 A * 3/1996 Aab .............................. 324/165
2005/0258820 A1* 11/2005 Forster .......................... 324/165
(Continued)

FOREIGN PATENT DOCUMENTS

JP    2000-337922 A    12/2000
JP    2004-184090 A    7/2004
(Continued)

OTHER PUBLICATIONS

International Search Report and Written Opinion dated Aug. 14, 2012 for the corresponding International Application No. PCT/JP2012/004265 (with English translation).

*Primary Examiner* — Reena Aurora
(74) *Attorney, Agent, or Firm* — Posz Law Group, PLC

(57) ABSTRACT

A moving object detection apparatus includes a current mirror circuit including first and second transistors connected in parallel between a power source and ground and having gates connected to a ground-side terminal of the first transistor, first and second magnetoresistive elements having pin layers and respectively arranged between the first and second transistors and the ground, a constant voltage circuit, a voltage output circuit having third and fourth transistors respectively arranged between the first and second transistors and the first and second magnetoresistive elements and respectively applying constant voltages to the first and second magnetoresistive elements based on output of the constant voltage circuit when the output of the constant voltage circuit is applied to gates of the third and fourth transistors, and a fifth transistor arranged between the second and fourth transistors to operate according to a potential of a power-source-side terminal of the fourth transistor.

9 Claims, 11 Drawing Sheets

(51) Int. Cl.
*G01B 7/00* (2006.01)
*G01D 5/14* (2006.01)
*H03K 17/95* (2006.01)

(56) References Cited

U.S. PATENT DOCUMENTS

2005/0270019 A1* 12/2005 Shinjo et al. ............. 324/207.25
2007/0200561 A1   8/2007  Yokotani et al.
2008/0297955 A1  12/2008  Ausserlechner
2009/0091344 A1   4/2009  Ausserlechner

FOREIGN PATENT DOCUMENTS

| | | |
|---|---|---|
| JP | 2005-233795 A | 9/2005 |
| JP | 2005-300246 A | 10/2005 |
| JP | 2008-268085 A | 11/2008 |
| JP | 2010-281767 A | 12/2010 |

* cited by examiner

US 9,062,955 B2

MOVING OBJECT DETECTION APPARATUS

CROSS REFERENCE TO RELATED APPLICATION

This application is a U.S. national stage application of International Patent Application No. PCT/JP2012/004265 filed on Jul. 2, 2012 and is based on Japanese Patent Application No. 2011-149212 filed on Jul. 5, 2011, the disclosure of which is incorporated herein by reference.

This application relates to Japanese patent Application No. 2011-149212 filed on Jul. 5, 2011, the contents of which are incorporated herein by reference.

TECHNICAL FIELD

The present disclosure relates to a moving object detection apparatus configured to detect a movement of a detection target made from a magnetic material.

BACKGROUND ART

It has been known to detect a rotation of a spur gear (rotor) as a detection target by using a bias magnet for generating a bias magnetic field applied to the spur gear, a first magnetic element pattern constructed with two magnetic elements connected in series and having resistances changing with a change in the bias magnetic field, and a second magnetic element pattern constructed with two magnetic elements connected in series and having resistances changing with a change in the bias magnetic field (for example, refer to Patent Document 1).

Specifically, in the first magnetic element pattern, a connection point between the two magnetic elements forms an output terminal for outputting an output signal. In the second magnetic element pattern, a connection point between the two magnetic elements forms an output terminal for outputting an output signal.

When the spur gear rotates, a magnetic line (magnetic vector) generated from the bias magnet is displaced in the rotation direction. Accordingly, the output signals of the first and second magnetic element patterns change. Then, a comparator compares the output signal of the first magnetic element pattern with the output signal of the second magnetic element pattern and outputs a detection signal indicative of a rotational angle of the spur gear.

In the Patent Document 1, the rotational angle of the spur gear can be detected by comparing the output signal of the first magnetic element pattern with the output signal of the second magnetic element pattern by using the comparator. However, as the distance between the spur gear and the bias magnet increases, the amount of displacement of the magnetic line in the rotation direction (i.e., the amount of change in the angle) decreases. Accordingly, the amount of change in the output signal of each of the first and second magnetic element patterns decreases. Therefore, it is difficult for the comparator to compare the output signals of the first and second magnetic element patterns.

The above problem can occur not only in an apparatus for detecting a rotation of a rotating spur gear but also in an apparatus for detecting a displacement of a detection target.

PRIOR ART

Patent Document

Patent Document 1: JP-A-2000-337922

SUMMARY OF THE INVENTION

In view of the above, it is an object of the present disclosure to provide a moving object detection apparatus for reducing a reduction in the amount of change in an output signal even when a detection target and a bias magnet are distanced from each other.

According to a first aspect of the present disclosure, a moving object detection apparatus includes a current mirror circuit including first and second transistors connected in parallel between a power source and a ground. The first and second transistors have gates connected to a ground-side terminal of the first transistor. The moving object detection apparatus further includes a first magnetoresistive element having a pin layer and located between the first transistor and the ground, a second magnetoresistive element having a pin layer and located between the second transistor and the ground, a constant voltage circuit configured to output a constant voltage, and a voltage output circuit including a third transistor located between the first transistor and the first magnetoresistive element and a fourth transistor located between the second transistor and the second magnetoresistive element. The voltage output circuit respectively applies constant voltages to the first and second magnetoresistive elements based on an output voltage of the constant voltage circuit, when the output voltage of the constant voltage circuit is applied to gates of the third and fourth transistors. The moving object detection apparatus further includes a fifth transistor located between the second and fourth transistors and configured to operate in accordance with a potential of a power-source-side terminal of the fourth transistor.

The first and second magnetoresistive elements are arranged so that magnetization directions of the pin layers are different from each other. Each of the first and second magnetoresistive elements has a resistance changing with a change in a component of a magnetic flux density, which is generated from a bias magnet, in the magnetization direction of the pin layer.

In a case where the magnetic flux densities detected by the first and second magnetoresistive elements change with a movement of a detection target made from a magnetic material, when the resistance of the first magnetoresistive element becomes larger than the resistance of the second magnetoresistive element, a first current flowing from the power source to the first magnetoresistive element becomes smaller than a second current flowing from the power source to the second magnetoresistive element, the second transistor reduces the second current according to a decrease in the first current, and the resistance of the second magnetoresistive element becomes smaller than the resistance of the first magnetoresistive element, the fifth transistor increases the second current according to a decrease in the resistance of the second magnetoresistive element to reduce a signal level outputted from a common connection terminal between a power-source-side terminal of the fifth transistor and a ground-side terminal of the second transistor.

Further, in the case, when the resistance of the first magnetoresistive element becomes smaller than the resistance of the second magnetoresistive element, the first current becomes larger than the second current, the second transistor increases the second current according to an increase in the first current, and the resistance of the second magnetoresistive element becomes larger than the resistance of the first magnetoresistive element, the fifth transistor reduces the second current according to an increase in the resistance of the second magnetoresistive element to increase the signal level outputted from the common connection terminal between the second and fifth transistors.

According to the first aspect, when the detection target moves, the resistance of the first magnetoresistive element becomes larger than the resistance of the second magnetoresistive element, and the resistance of the second magnetoresistive element becomes smaller than the resistance of the first magnetoresistive element. Further, when the detection target moves, the resistance of the first magnetoresistive element becomes smaller than the resistance of the second magnetoresistive element, and the resistance of the second magnetoresistive element becomes larger than the resistance of the first magnetoresistive element.

In this way, since the resistances of the first and second magnetoresistive elements change in opposite directions so that the first current and the second current can increase and decrease, the level of the output signal of the common connection terminal between the second and fifth transistors changes. Thus, even when the detection target and the bias magnet are distanced from each other, a reduction in the change in the output signal can be reduced.

It is noted that the movement according to the present disclosure is not limited to a displacement of the detection target to another position but includes a rotation of the detection target.

According to a second aspect of the present disclosure, when the detection target moves, a first state and a second state are repeatedly alternated. In the first state, the resistance of the first magnetoresistive element becomes larger than the resistance of the second magnetoresistive element, and the resistance of the second magnetoresistive element becomes smaller than the resistance of the first magnetoresistive element. In the second state, the resistance of the first magnetoresistive element becomes smaller than the resistance of the second magnetoresistive element, and the resistance of the second magnetoresistive element becomes larger than the resistance of the first magnetoresistive element.

According to a third aspect of the present disclosure, when the detection target moves, a zero magnetic flux density portion where the magnetic flux density generated from the bias magnet is zero passes the first and second magnetoresistive elements repeatedly so that the first state and the second state are repeatedly alternated.

According to the third aspect, when the detection target moves, the zero magnetic flux density portion passes the first and second magnetoresistive elements repeatedly. Thus, magnetic flux densities detected by the first and second magnetoresistive elements can change adequately. Accordingly, the resistances of the first and second magnetoresistive elements can change adequately, and the first and second currents can change adequately. Therefore, the fifth transistor can surely serve to increase or decrease the second current. Thus, even when the detection target and the bias magnet are distanced from each other, the reduction in the change in the output signal can be surely reduced.

According to a fourth aspect of the present disclosure, the moving object detection apparatus further includes a variable resistive element and a control circuit. The variable resistive element has a controllable resistance and is connected in parallel to the first magnetoresistive element between the third transistor and the ground. The control circuit controls the resistance of the variable resistive element in accordance with the signal outputted from the common connection terminal between the second and fifth transistors in such a manner that a change in the current flowing from the power source to the first and third transistors exhibits hysteresis with respect to a change in the magnetic flux density detected by the first magnetoresistive element.

According to the fourth aspect, even when hunting occurs in the magnetic flux density detected by the first magnetoresistive element, a repetition of increase and decrease in the currents flowing through the first and third transistors can be reduced. Thus, the signal level outputted from the common connection terminal between the second and fifth transistors can be stabilized.

According to a fifth aspect of the present disclosure, the moving object detection apparatus further includes a first resistive element connected in parallel to the first magnetoresistive element between the third transistor and the ground, and a second resistive element connected in parallel to the second magnetoresistive element between the fourth transistor and the ground. The resistances of the first and second resistive elements are set so that a characteristic indicating a relationship between a combined resistance of the first magnetoresistive element and the first resistive element and the magnetic flux density of the first magnetoresistive element becomes opposite to a characteristic indicating a relationship between a combined resistance of the second magnetoresistive element and the second resistive element and the magnetic flux density of the second magnetoresistive element.

According to the fifth aspect, even when the characteristic indicating the relationship between the resistance and the magnetic flux density of the first magnetoresistive element is not opposite to the characteristic indicating the relationship between the resistance and the magnetic flux density of the second magnetoresistive element due to variations in the first and second magnetoresistive elements, the variations in the first and second magnetoresistive elements can be corrected by using the first and second resistive elements.

According to a sixth aspect of the present disclosure, each of the first and second magnetoresistive elements is a tunnel magnetoresistive element.

In general, it is necessary that a voltage applied to a tunnel magnetoresistive element is small in order to prevent its tunnel layer from being broken.

According to the sixth embodiment, the voltages applied to the first and second magnetoresistive elements depend on the output voltage of the constant voltage circuit. Since the voltages applied to the first and second magnetoresistive elements can be controlled by controlling the output voltage of the constant voltage circuit, it is easy to set the voltages applied to the first and second magnetoresistive elements as tunnel magnetoresistive elements to small values.

In general, a change in resistance with a change in magnetic flux density is larger in a tunnel magnetoresistive element than in a GMR (giant magnetic resistance element). Therefore, even when the change in magnetic flux density is small, the change in the first current and the change in the second current can be increased. Accordingly, the change in the output signal can be increased.

According to a seventh aspect of the present disclosure, the first and second magnetoresistive elements are arranged in such a manner that the magnetization directions of the pin layers are opposite to each other.

According to an eighth aspect of the present disclosure, the first and second magnetoresistive elements are arranged in such a manner that the magnetization directions of the pin layers are parallel to a direction connecting a S-pole and a N-pole of the bias magnet.

Thus, the magnetic flux densities detected by the first and second magnetoresistive elements can change adequately. Accordingly, the resistances of the first and second magnetoresistive elements can change adequately, and the first and second currents can change adequately.

In addition, like the seventh aspect, when the first and second magnetoresistive elements are arranged in such a manner that the magnetization directions of the pin layers are opposite to each other, the changes in the magnetic flux densities detected by the first and second magnetoresistive elements can be increased. Accordingly, the changes in the resistances of the first and second magnetoresistive elements can be increased.

According to a ninth aspect of the present disclosure, the first and second magnetoresistive elements are arranged in such a manner that the magnetization directions of the pin layers are orthogonal to each other.

BRIEF DESCRIPTION OF THE DRAWINGS

The above and other objects, features and advantages of the present disclosure will become more apparent from the following detailed description made with reference to the accompanying drawings. In the drawings.

EMBODIMENTS OF THE INVENTION

Figure 1:
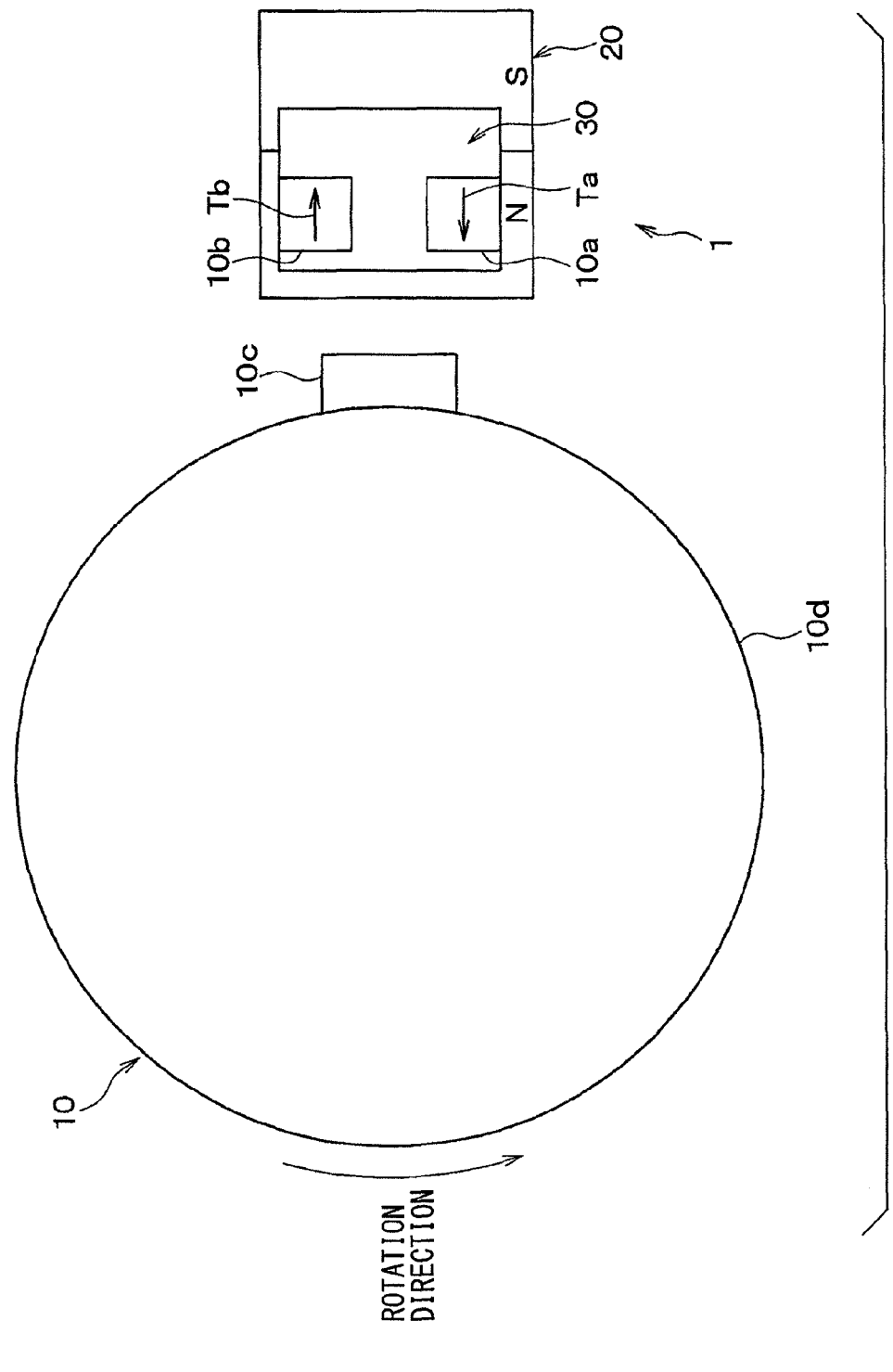
FIG. 1 is a diagram illustrating a schematic configuration of a rotation detection apparatus according to a first embodiment of the present disclosure.

Embodiments of the present disclosure will be described below with reference to the drawings. Throughout the embodiments, the same symbols denote the same or equivalent parts in the drawing for the sake of simplicity of description.

First Embodiment

A rotation detection apparatus 1 according to a first embodiment of the present disclosure is illustrated in FIG. 1. FIG. 1 is a diagram illustrating a schematic configuration of the rotation detection apparatus 1.

The rotation detection apparatus 1 illustrated in FIG. 1 detects a rotation of a spur gear 10 as a detection target by using TMRs 10a, 10b, and includes a bias magnet 20 and a circuit chip 30 in addition to the TMRs 10a, 10b.

The spur gear 10 is a rotor made from a magnetic material such as iron. The bias magnet 20 is a permanent magnet, and an S-pole and an N-pole are arranged in line, for example, in a radial direction of the spur gear 10 (lateral direction in the drawing). According to the present embodiment, the bias magnet 20 is oriented so that the N-pole can face the outer peripheral portion of the spur gear 10. For example, the bias magnet 20 is shaped like a substantially square plate.

The circuit chip 30 is a circuit board on which a rotation detection circuit including the TMRs 10a, 10b is implemented, and is mounted on the bias magnet 20. A circuit configuration of the rotation detection apparatus 1 will be described later.

The TMRs 10a, 10b are mounted on the circuit chip 30. The TMRs 10a, 10b are located on the near side of the bias magnet 20 to the spur gear 10. Each of the TMRs 10a, 10b is a conventional tunnel magnetoresistive element having a tunnel layer and a pin layer.

According to the present embodiment, a magnetization direction of the pin layer of each of the TMRs 10a, 10b is parallel to a direction connecting the S-pole and the N-pole of the bias magnet 20. The TMRs 10a, 10b are arranged so that the magnetization directions of the pin layers can be opposite to each other.

An arrow Ta in FIG. 1 indicates the magnetization direction of the pin layer of the TMR 10a, and an arrow Tb in FIG. 1 indicates the magnetization direction of the pin layer of the TMR 10b.

Figure 2:
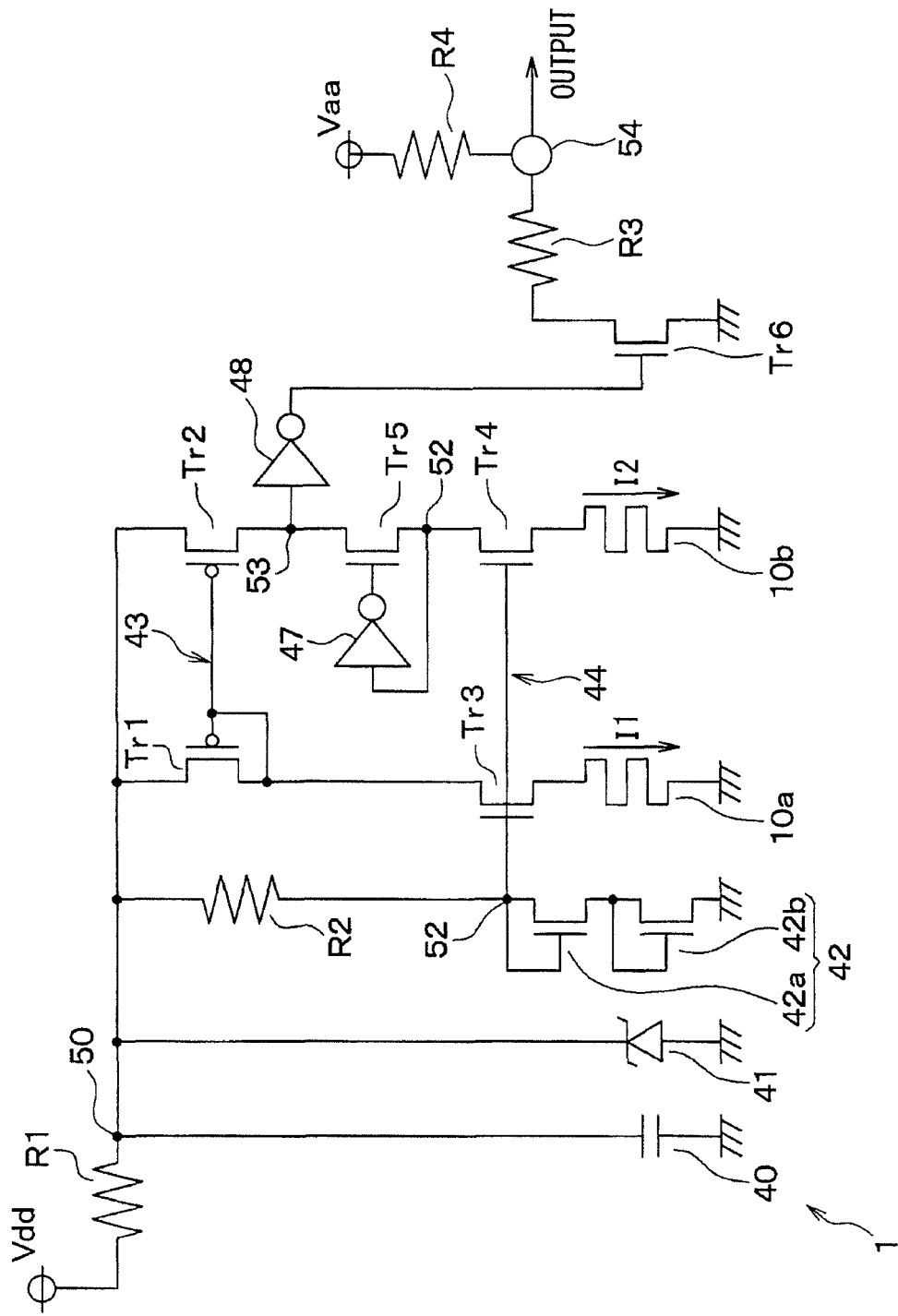
FIG. 2 is a diagram illustrating an electrical circuit configuration of the rotation detection apparatus of FIG. 1.

FIG. 2 illustrates a circuit configuration of the rotation detection apparatus 1 according to the present embodiment. The rotation detection apparatus 1 includes resistive elements R1, R2, R3, and R4, a capacitor 40, a zener diode 41, a constant voltage circuit 42, a current mirror circuit 43, a voltage output circuit 44, transistors Tr5, Tr6, a buffer circuit 47, and an inverter circuit 48.

The resistive element R1 and the capacitor 40 are connected in series between a positive electrode of a power source Vdd and a ground to form a low-pass filter circuit.

The zener diode 41 is connected between a common connection terminal 50 between the resistive element R1 and the capacitor 40 and the ground to form an overvoltage protection element for absorbing an overvoltage between the common connection terminal 50 and the ground.

The constant voltage circuit 42 outputs a constant voltage in accordance with a voltage supplied from the common connection terminal 50 through the resistive element R2. Specifically, the constant voltage circuit 42 includes transistors 42a, 42b. The transistors 42a, 42b are connected in series between the resistive element R2 and the ground. Each of the transistors 42a, 42b is an nMOS transistor with a gate connected to a drain. Thus, a constant voltage is outputted from a common connection terminal 52 between the gate and the drain of the power source side transistor 42a out of the transistors 42a, 42b. The constant voltage is set by threshold voltages of the transistors 42a, 42b.

The current mirror circuit 43 includes transistors Tr1, Tr2. The transistors Tr1, Tr2 are pMOS transistors and connected in parallel between the common connection terminal 50 and the ground. Gates of the transistors Tr1, Tr2 are connected together to a drain of the transistor Tr1.

The voltage output circuit 44 includes transistor Tr3, Tr4. The transistor Tr3 is arranged between the transistor Tr1 and the ground. The transistor Tr4 is arranged between the transistor Tr2 and the ground. The TMR 10a is arranged between the transistor Tr3 and the ground. The TMR 10b is arranged between the transistor Tr4 and the ground.

An output voltage of the constant voltage circuit 42 is applied to gates of the transistors Tr3, Tr4. Therefore, a constant voltage (V−Vth1) obtained by subtracting a threshold voltage Vth1 of the transistor Tr3 from an output voltage V of the constant voltage circuit 42 is applied between both terminals of the TMR 10a. A constant voltage (V−Vth2) obtained by subtracting a threshold voltage Vth2 of the transistor Tr4 from the output voltage V of the constant voltage circuit 42 is applied between both terminals of the TMR 10b.

The transistor Tr5 is an nMOS transistor and arranged between the transistors Tr2, Tr4.

The buffer circuit 47 is arranged between a gate and a source of the transistor Tr5 and controls the transistor Tr5 in accordance with a potential of the common connection terminal 52.

In FIG. 2, the buffer circuit 47 is indicated by a circuit symbol for an inverter circuit. However, the buffer circuit 47 continuously changes a level of an output signal in accordance with the potential of the common connection terminal 52. Specifically, when the potential of the common connection terminal 52 increases, the output signal level of the buffer circuit 47 decreases, and when the potential of the common connection terminal 52 decreases, the output signal level of the buffer circuit 47 increases. The common connection terminal 52 is a common connection terminal between the source of the transistor Tr5 and a drain of the transistor Tr4.

The inverter circuit 48 outputs a high-level signal or a low-level signal in accordance with a signal outputted from a common connection terminal 53. The common connection terminal 53 is a common connection terminal between a drain of the transistor Tr2 and the drain of the transistor Tr5.

The transistor Tr6 is arranged between a power source Vaa and the ground and is turned ON and OFF in accordance with an output signal of the inverter circuit 48. The resistive elements R3, R4 are connected in series between the transistor Tr6 and the power source Vaa. A sensor signal is outputted from a common connection terminal 54 between the resistive elements R3, R4. As describe later, the sensor signal indicates a rotation angle of the spur gear 10.

The output voltage of a power source Vdd of the embodiment is set to a voltage value different from an output voltage of the power source Vaa.

Figure 3:
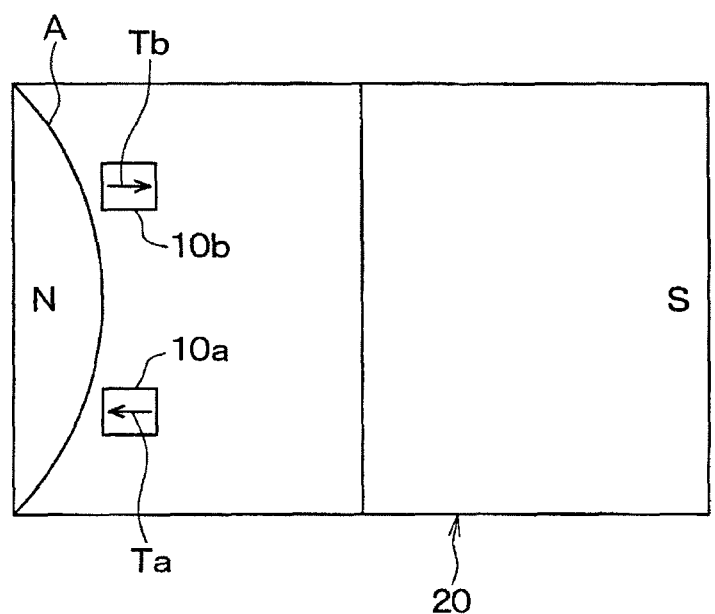
FIG. 3 is a diagram illustrating a layout of a bias magnet and a TMR of FIG. 1.
Figure 4:
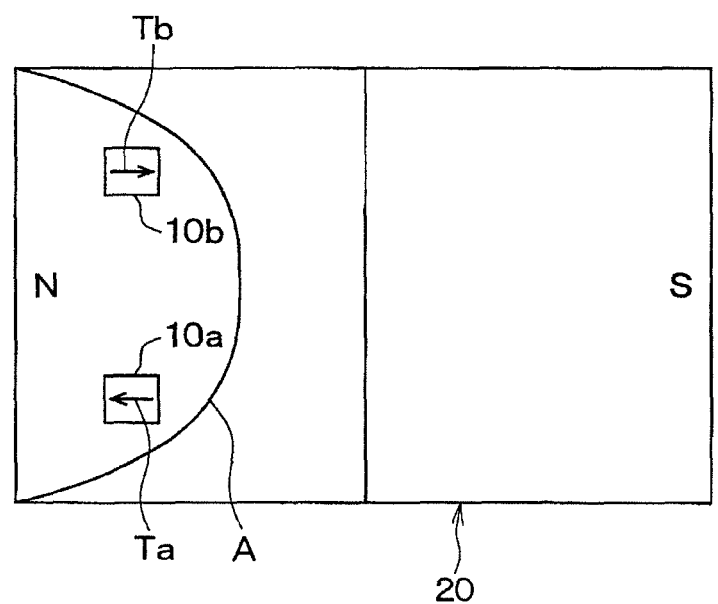
FIG. 4 is a diagram illustrating a layout of the bias magnet and the TMR of FIG. 1.
Figure 5:
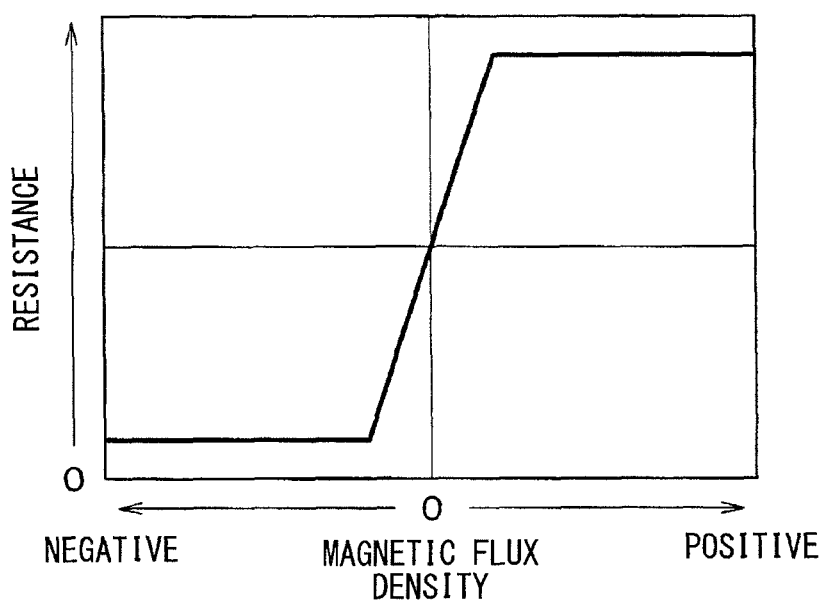
FIG. 5 is a characteristic diagram illustrating a relationship between a magnetic flux density and a resistance of the TMR of FIG. 1.
Figure 6:
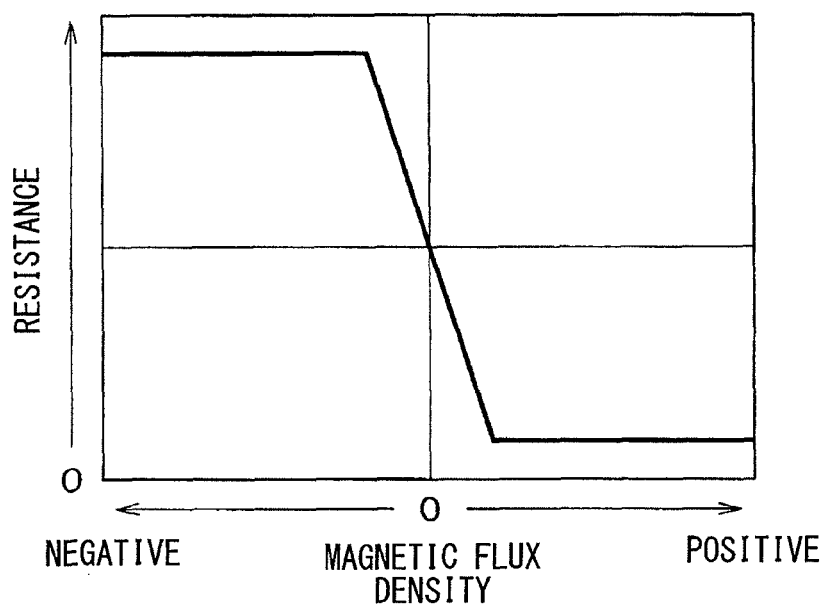
FIG. 6 is a characteristic diagram illustrating a relationship between a magnetic flux density and a resistance of the TMR of FIG. 1.

Next, an operation of the rotation detection apparatus 1 according to the present embodiment will be described. FIG. 3 and FIG. 4 are diagrams illustrating a layout of the bias magnet 20 and the TMRs 10a, 10b. FIG. 5 is a characteristic diagram illustrating a relationship between a resistance and a magnetic flux density of the TMR 10a, and FIG. 6 is a characteristic diagram illustrating a relationship between a resistance and a magnetic flux density of the TMR 10b.

When the spur gear 10 rotates, a first state, in which a top 10c of the spur gear 10 approaches the bias magnet 20 (refer to FIG. 1), and a second state, in which a bottom 10d of the spur gear 10 approaches the bias magnet 20, are repeatedly alternated.

Since the first state and the second state are repeatedly alternated as described above, the distribution of magnetic line of force generated from the bias magnet 20 alternately changes.

In the first state, as illustrated in FIG. 4, a 0 mT line A is on the opposite side to the spur gear 10 with respect to the TMRs 10a, 10b. The 0 mT line A is a zero magnetic flux density portion at which the density of the magnetic flux generated from the bias magnet 20 is zero.

In the second state, as illustrated in FIG. 3, the 0 mT line A is on the same side as the spur gear 10 with respect to the TMRs 10a, 10b. Therefore, when the spur gear 10 rotates, the 0 mT line A repeatedly passes the TMRs 10a, 10b. In other words, the 0 mT line A repeatedly reciprocates over a region where the TMRs 10a, 10b are located.

The resistance of each of the TMRs 10a, 10b changes with the magnetic flux density of the pin layer in the magnetization direction. The TMRs 10a, 10b are oriented so that the magnetization directions of the pin layers can be opposite to each other. Therefore, the TMRs 10a, 10b have opposite characteristics indicating the relationship between the magnetic flux density and the resistance.

Therefore, as illustrated in FIG. 5, when the magnetic flux density increases from zero, the resistance of the TMR 10a increases toward a maximum value and finally saturated to the maximum value, and when the magnetic flux density decreases from zero, the resistance of the TMR 10a decreases toward a minimum value and finally saturated to the minimum value. In contrast, as illustrated in FIG. 6, when the magnetic flux density increases from zero, the resistance of the TMR 10b decreases toward a minimum value and finally saturated to the minimum value, and when the magnetic flux density decreases from zero, the resistance of the TMR 10b increases toward a maximum value and finally saturated to the maximum value.

According to the present embodiment, the TMRs 10a, 10b are arranged in parallel to a magnetizing direction of the bias magnet 20. The magnetizing direction is a direction from the N-pole toward the S-pole of the bias magnet 20.

Therefore, when the 0 mT line A moves to the opposite side to the spur gear 10 with respect to the TMRs 10a, 10b, the magnetic flux density detected by the TMRs 10a, 10b increases. As a result, the resistance of the TMR 10a becomes larger than the resistance of the TMR 10b and reaches the maximum value, and the resistance of the TMR 10b becomes smaller than the resistance of the TMR 10a and reaches the minimum value (refer to FIG. 5 and FIG. 6).

In contrast, when the 0 mT line A moves to the same side as the spur gear 10 with respect to the TMRs 10a, 10b, the magnetic flux density detected by the TMRs 10a, 10b decreases. Therefore, the resistance of the TMR 10a becomes smaller than the resistance of the TMR 10b and reaches the minimum value, and the resistance of the TMR 10a becomes larger than the resistance of the TMR 10b and reaches the maximum value (refer to FIG. 5 and FIG. 6).

As described above, in the first state, since the resistance of the TMR 10a becomes larger than the resistance of the TMR 10b, a first current I1 becomes smaller than a second current I2.

The first current I1 flows from the power source Vdd to the ground through the resistive element R1, the transistors Tr1, Tr3, and the TMR 10a. The second current I2 flows from the power source Vdd to the ground through the resistive element R1, the transistors Tr2, Tr5, Tr4, and the TMR 10b.

The potential of the drain of the transistor Tr3 increases with a reduction in the first current I1. The potential of the gate of the transistor Tr2 increases with the increase in the potential of the drain of the transistor Tr3. Therefore, the transistor Tr2 acts to reduce the second current I2.

In the first state, the resistance of the TMR 10b is smaller than the resistance of the TMR 10a. Therefore, even when the transistor Tr4 causes the reduced second current I2 to flow toward the TMR 10b, the potential of the drain of the transistor Tr4 decreases. A potential of an input terminal of the buffer circuit 47 decreases with the decrease in the potential of the drain of the transistor Tr4. The level of the output signal of the buffer circuit 47 increases accordingly. Thus, an ON resistance of the transistor Tr5 decreases so that the transistor T5 can act to increase the second current I. Therefore, the level of the output signal outputted from the common connection terminal 53 between the transistors Tr2, Tr5 decreases. Accordingly, the inverter circuit 48 outputs a high-level signal to the transistor Tr6. As a result, the transistor Tr6 is turned ON, and a low level signal as the sensor signal is outputted from the common connection terminal 54 between the resistive elements R3, R4.

On the other hand, in the second state, since the resistance of the TMR 10a is smaller than the resistance of the TMR 10b, the first current I1 is larger than the second current I2. Accordingly, the potential of the drain of the transistor Tr2 decreases. The potential of the gate of the transistor Tr2 decreases with the decrease in the potential of the drain of the transistor Tr2. Therefore, the transistor Tr2 acts to increase the second current I2.

In the second state, the resistance of the TMR 10b is larger than the resistance of the TMR 10a. For this reason, when the transistor Tr2 acts to increase the second current I2 in a manner as described above, the potential of the drain of the transistor Tr4 increases.

The potential of the input terminal of the buffer circuit 47 increases with the increase in the potential of the drain of the transistor Tr4. The level of the output signal of the buffer circuit 47 decreases accordingly. Thus, the ON resistance of the transistor Tr5 increases so that the transistor Tr5 can act to reduce the second current I2. Therefore, the level of the output signal of the common connection terminal 53 between the transistors Tr2, Tr5 increases. Accordingly, the inverter circuit 48 outputs a low-level signal to the transistor Tr6. As a result, the transistor Tr6 is turned OFF, and a high-level signal as the sensor signal is outputted from the common connection terminal 54 between the resistive elements R3, R4.

In this way, when the spur gear 10 rotates, the first state and the second state are repeatedly alternated. Thus, a state, in which the resistance of the TMR 10a is larger than the resistance of the TMR 10b so that the resistance of the TMR 10b can be smaller than the resistance of the TMR 10a, and a state, in which the resistance of the TMR 10a is smaller than the resistance of the TMR 10b so that the resistance of the TMR 10b can be larger than the resistance of the TMR 10a, are repeatedly alternated. Accordingly, the signal level of the sensor signal outputted from the common connection terminal 54 alternately changes between a low level and a high level.

As described above, according to the present embodiment, when the resistance of the TMR 10a becomes larger than the resistance of the TMR 10b during rotation of the spur gear 10, the first current I1 decreases, and the potential of the gate terminal of the transistor Tr2 increases with the decrease in the first current I1. Accordingly, the transistor Tr2 acts to reduce the second current I2. At this time, since the resistance of the TMR 10b becomes smaller than the resistance of the TMR 10a, the potential of the drain of the transistor Tr4 decreases. Therefore, the level of the output signal of the buffer circuit 47 increases. Thus, the ON resistance of the transistor Tr5 decreases so that the level of the output signal of the common connection terminal 53 can decrease.

In contrast, when the resistance of the TMR 10a becomes smaller than the resistance of the TMR 10b, the first current I1 increases so that the potential of the gate terminal of the transistor Tr2 can increase. Accordingly, the transistor Tr2 acts to increase the second current I2. At this time, since the resistance of the TMR 10b becomes larger than the resistance of the TMR 10a, the potential of the drain of the transistor Tr4 increases. Therefore, the level of the output signal of the buffer circuit 47 decreases. Thus, the ON resistance of the transistor Tr5 increases so that the level of the output signal of the common connection terminal 53 can increase.

Therefore, even when the spur gear 10 and the bias magnet 20 are distanced from each other, the 0 mT line A repeatedly passes the TMRs 10a, 10b during rotation of the spur gear 10. Thus, the resistances of the TMR 10a, 10b can change adequately during rotation of the spur gear 10. Accordingly, since the potential of the drain of the transistor Tr4 changes adequately, the increase and decrease in the ON resistance of the transistor Tr5 can be surely controlled by the buffer circuit 47. Therefore, a reduction in the change in the level of the signal outputted from the common connection terminal 53 (54) can be reduced.

According to the present embodiment, the TMRs 10a, 10b are used as the first and second magnetic resistance elements. In general, a change in resistance with a change in magnetic flux density is larger in a TMR (tunnel magnetoresistive element) than in a GMR (giant magnetic resistance element). Therefore, even when a change in magnetic flux density is small, a change in the first current I1 and a change in the second current I2 can be increased. Accordingly, a change in the potential of the common connection terminal 52 can be increased. Thus, a change in the ON resistance of the transistor Tr5 can be increased by the buffer circuit 47. Therefore, a change in the signal level outputted from the common connection terminal 53 can be increased.

According to the present embodiment, when the spur gear 10 rotates, a resistance r of the TMRs 10a, 10b changes within a range from a minimum value to a maximum value (minimum value≤r≤maximum value). Thus, since the change in the resistance of the TMRs 10a, 10b can be increased adequately, the change in the potential of the drain of the transistor Tr4 is surely ensured. Therefore, the reduction in the change in the level of the signal outputted from the common connection terminals 53, 54 can be reduced.

According to the present embodiment, as described above, the constant voltage (V−Vth1) obtained by subtracting the threshold voltage Vth1 of the transistor Tr3 from the output voltage V of the constant voltage circuit 42 is applied between both terminals of the TMR 10a. The constant voltage (V−Vth2) obtained by subtracting the threshold voltage Vth2 of the transistor Tr4 from the output voltage V of the constant voltage circuit 42 is applied between both terminals of the TMR 10b. Therefore, the voltages applied to the TMRs 10a, 10b are set by the output voltage V of the constant voltage circuit 42 and the threshold voltages Vth1, Vth2 of the transistors Tr3, Tr4.

In general, it is necessary that the voltages applied to the TMRs 10a, 10b are small in order to prevent their tunnel layers from being broken.

In this regard, according to the present embodiment, as described above, the voltages applied to the TMRs 10a, 10b are set by the output voltage V of the constant voltage circuit 42 and the threshold voltages Vth1, Vth2 of the transistors Tr3, Tr4. Therefore, it is easy to set the voltages applied to the TMRs 10a, 10b to small values.

The voltage applied to the individual TMR may be reduced by connecting multiple TMRs in series between the positive terminal of the power source and the ground. However, the use of multiple TMRs may result in an increase in the size of the rotation detection apparatus 1.

In this regard, according to the present embodiment, as described above, only two TMR 10a, 10b are used. Therefore, the increase in the size of the rotation detection apparatus 1 can be reduced.

According to the present embodiment, the rotation detection apparatus 1 is constructed with as few as six transistors Tr1, Tr2, Tr3, Tr4, Tr5, and Tr6. In such an approach, an increase in the circuit size of the rotation detection apparatus 1 can be reduced.

Second Embodiment

Figure 7:
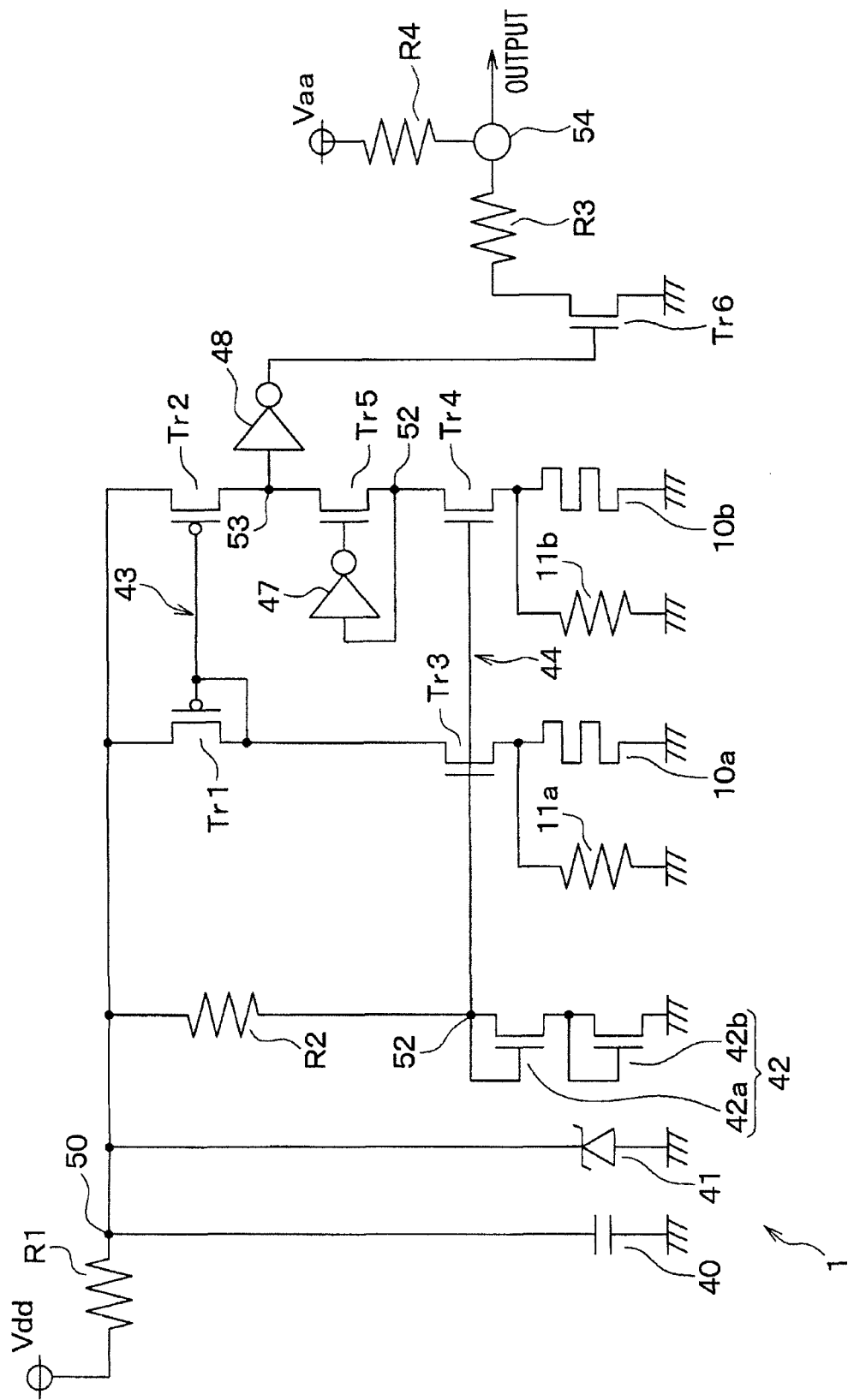
FIG. 7 is a diagram illustrating an electrical circuit configuration of a rotation detection apparatus according to a second embodiment of the present disclosure.

According to a second embodiment, variations in the characteristics indicating the relationship between the magnetic flux density and the resistance of the TMRs 10a, 10b are corrected. FIG. 7 illustrates a circuit configuration of a rotation detection apparatus 1 according to the present embodiment.

As illustrated in FIG. 7, the rotation detection apparatus 1 further includes resistive elements 11a, 11b compared to the rotation detection apparatus 1 illustrated in FIG. 1.

The resistive element 11a is connected in parallel to the TMR 10a between the transistor Tr3 and the ground. The resistive element 11b is connected in parallel to the TMR 10b between the transistor Tr4 and the ground.

A combined resistance of the resistive element 11a and the TMR 10a is hereinafter referred to as r1, and a combined resistance of the resistive element 11b and the TMR 10b is hereinafter referred to as r2.

The resistive elements 11a, 11b perform correction so that a characteristic indicating a relationship between the magnetic flux density of the TMR 10a and the combined resistance r1 can be opposite to a characteristic indicating a relationship between the magnetic flux density of the TMR 10b and the combined resistance r2.

As described above, according to the present embodiment, even when the TMRs 10a, 10b do not have opposite relationships <magnetic flux density-resistance characteristics> due to variations, the resistive elements 11a, 11b allow the characteristic indicating the relationship between the magnetic flux density of the TMR 10a and the combined resistance r1 to be opposite to the characteristic indicating the relationship between the magnetic flux density of the TMR 10b and the combined resistance r2.

Assuming that the TMRs 10a, 10b do not have opposite relationships <magnetic flux density-resistance characteristics> due to manufacturing variations, even when the magnetic flux densities detected by the TMRs 10a, 10b change with rotation of the spur gear 10, the resistances of the TMRs 10a, 10b may not adequately change with rotation of the spur gear 10.

In this regard, according to the present embodiment, as described above, the resistive elements 11a, 11b allow the characteristic indicating the relationship between the magnetic flux density of the TMR 10a and the combined resistance r1 to be opposite to the characteristic indicating the relationship between the magnetic flux density of the TMR 10b and the combined resistance r2. Thus, each time the 0 mT line A repeatedly passes the TMRs 10a, 10b during rotation of the spur gear 10, the resistances of the TMR 10a, 10b can surely change with rotation of the spur gear 10 in opposite directions. Accordingly, the potential of the common connection terminal 52 and the level of the output signal of the buffer circuit 47 can change adequately. Therefore, like in the first embodiment, the level of the output signal outputted from the common connection terminals 53, 54 can change adequately.

Third Embodiment

Figure 8:
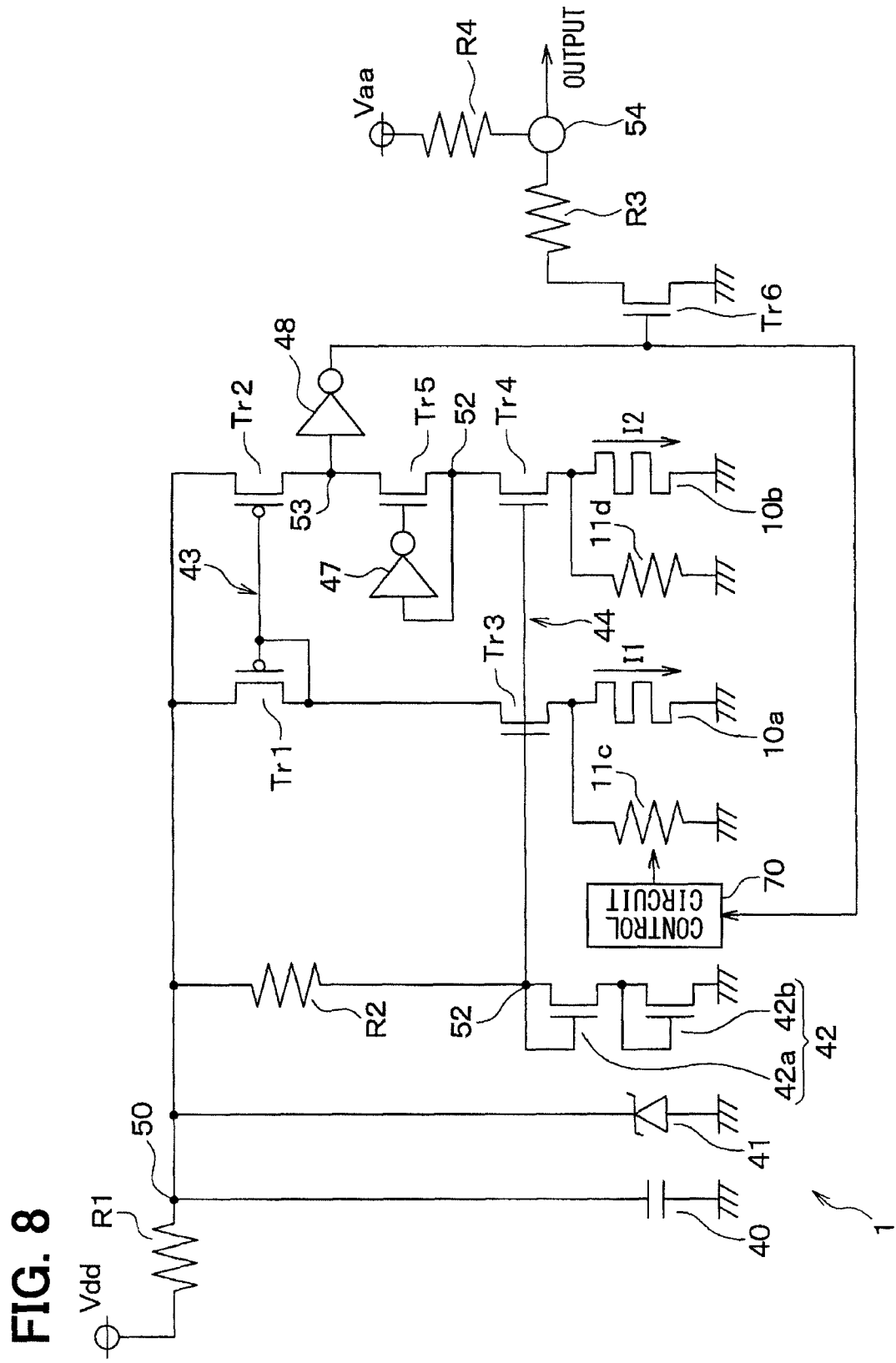
FIG. 8 is a diagram illustrating an electrical circuit configuration of a rotation detection apparatus according to a third embodiment of the present disclosure.

According to a third embodiment, a change in the first current I1 flowing from the power source Vdd to the transistors Tr1, Tr3 exhibits hysteresis with respect to a change in the magnetic flux density detected by the TMR 10a. FIG. 8 illustrates a circuit configuration of a rotation detection apparatus 1 according to the present embodiment.

As illustrated in FIG. 8, the rotation detection apparatus 1 further includes a variable resistive element 11c, a resistive element 11d, and a control circuit 70 compared to the rotation detection apparatus 1 illustrated in FIG. 1. The variable resistive element 11c is arranged in parallel to the TMR 10a between the transistor Tr1 and the ground. The resistive element 11d is arranged in parallel to the TMR 10b between the transistor Tr4 and the ground. According to the present embodiment, a maximum value Rmax of the variable resistive element 11c is set equal to a resistance of the resistive element 11d. The control circuit 70 controls a resistance of the variable resistive element 11c in accordance with the output voltage of the inverter circuit 48.

In the rotation detection apparatus 1 according to the present embodiment, like the first embodiment, the output signal level of the inverter circuit 48 becomes a high-level, when the resistance of the TMR 10a is larger than the resistance of the TMR 10b, and the first current I1 is smaller than the second current I2. At this time, the control circuit 70 sets the resistance of the variable resistive element 11c to a minimum value Rmin. In such an approach, even when the magnetic flux density detected by the TMR 10a varies to some extent, a variation in the first current I1 flowing from the power source Vdd to the transistors Tr1, Tr3 can be reduced.

In contrast, when the resistance of the TMR 10a is smaller than the resistance of the TMR 10b, and the first current I1 is larger than the second current I2, the output signal level of the inverter circuit 48 becomes a low-level. At this time, the control circuit 70 sets the resistance of the variable resistive element 11c to the maximum value Rmax. In such an approach, even when the magnetic flux density detected by the TMR 10a varies to some extent, the variation in the first current I1 flowing from the power source Vdd to the transistors Tr1, Tr3 can be reduced.

As described above, according to the present embodiment, the control circuit 70 controls the resistance of the variable resistive element 11c in accordance with the output signal of the inverter circuit 48. In such an approach, the change in the first current I1 flowing to the transistors Tr1, Tr3 can exhibit hysteresis with respect to the change in the magnetic flux density detected by the TMR 10a. Therefore, even if the magnetic flux density detected by the TMR 10a varies to some extent when the output signal level of the inverter circuit 48 changes, the first current I1 flowing in the transistors Tr1, Tr3 can surely increase or decrease. As a result, chattering of the output signal outputted from the common connection terminals 53, 54 can be prevented.

Fourth Embodiment

Figure 9:
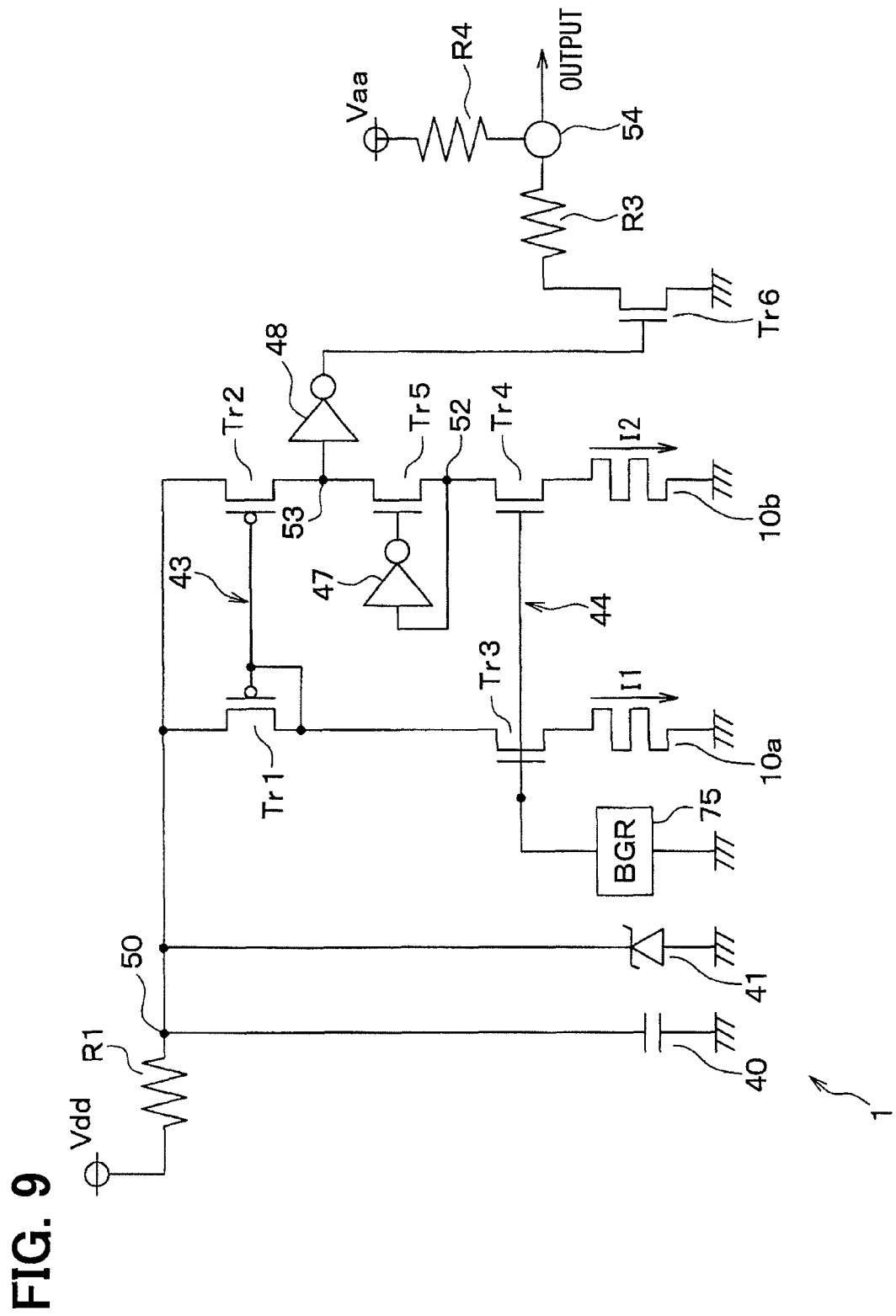
FIG. 9 is a diagram illustrating an electrical circuit configuration of a rotation detection apparatus according to a fourth embodiment of the present disclosure.

According to the first to third embodiments described above, the constant voltage circuit 42 is constructed with the transistors 42a, 42b. Alternatively, according to a fourth embodiment, as illustrated in FIG. 9, a bandgap reference voltage generation circuit (denoted as BGR in the drawing) 75 is used as a constant voltage circuit for outputting a constant voltage to the gates of the transistors Tr3, Tr4.

Fifth Embodiment

According to the first to fourth embodiments described above, the spur gear 10 as a detection target and the bias magnet 20 are provided separately. Alternatively, according to a fifth embodiment, a magnetizing rotor 76 in which a detection target and a bias magnet are integrated (refer to FIG. 10) is used.

Figure 10:
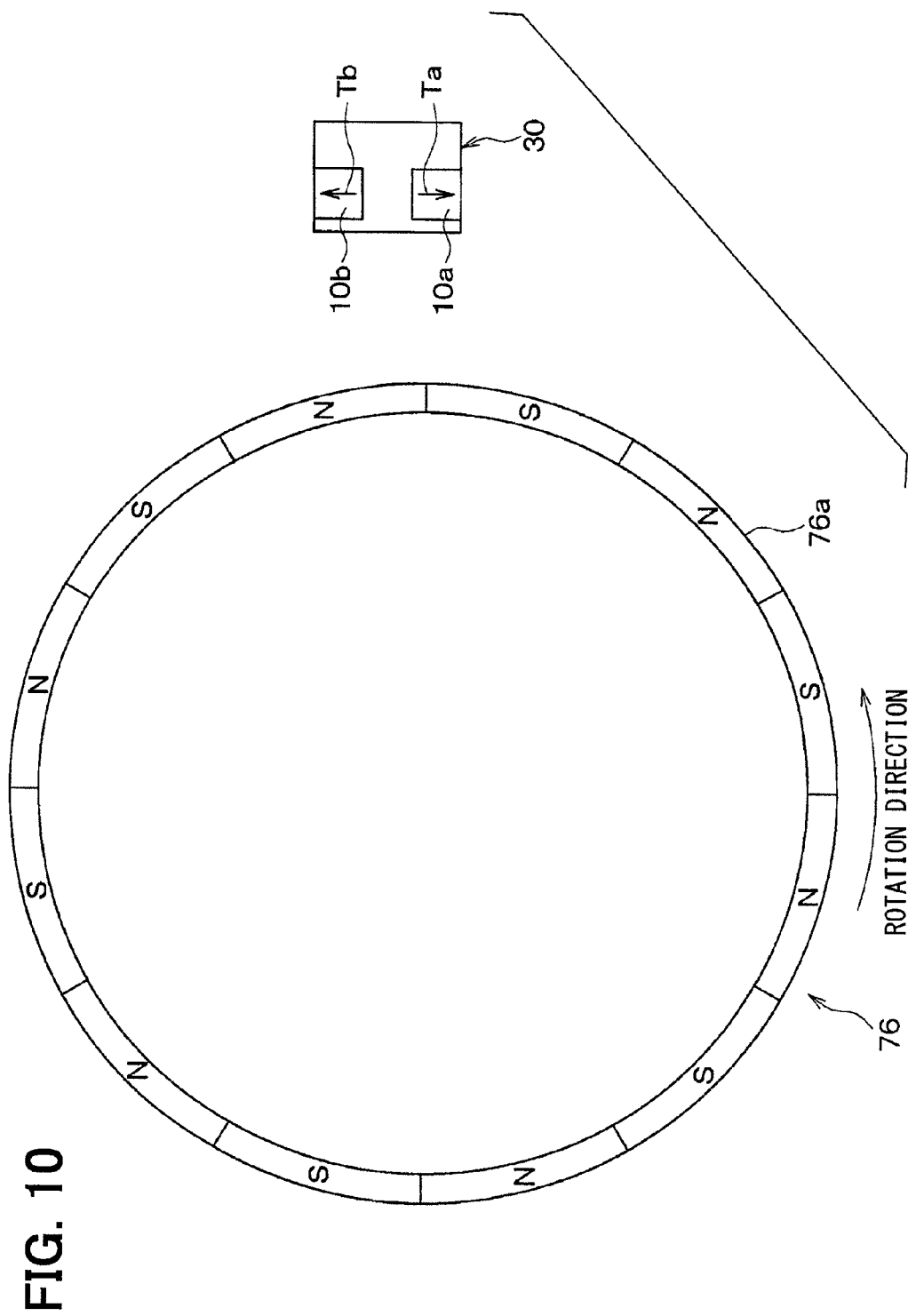
FIG. 10 is a diagram illustrating a schematic configuration of a rotation detection apparatus according to a fifth embodiment of the present disclosure.

As illustrated in FIG. 10, according to the present embodiment, the magnetizing rotor 76 is formed into a disk shape. A ring-shaped magnet 76a is provided around the outer periphery of the magnetizing rotor 76. The magnet 76a includes multiple S-poles and multiple N-poles. In the magnet 76a, the S-poles and the N-poles are alternately arranged in the circumference direction. According to the present embodiment, the magnet 76a includes six S-poles and six N-poles.

According to the present embodiment, the magnetization directions of the pin layers of the TMRs 10a, 10b (denoted as Ta, Tb in FIG. 10) are orthogonal to a radial direction of the magnetizing rotor 76. Specifically, the magnetization direction of the pin layer of the TMR 10a (denoted as Ta in FIG. 10) is defined as a direction Yb orthogonal to the radial direction of the magnetizing rotor 76. The magnetization direction of the pin layer of the TMR 10b (denoted as Tb in FIG. 10) is defined as a direction Ya which is opposite to the direction Yb and orthogonal to the radial direction of the magnetizing rotor 76 (refer to FIG. 12).

Figure 11:
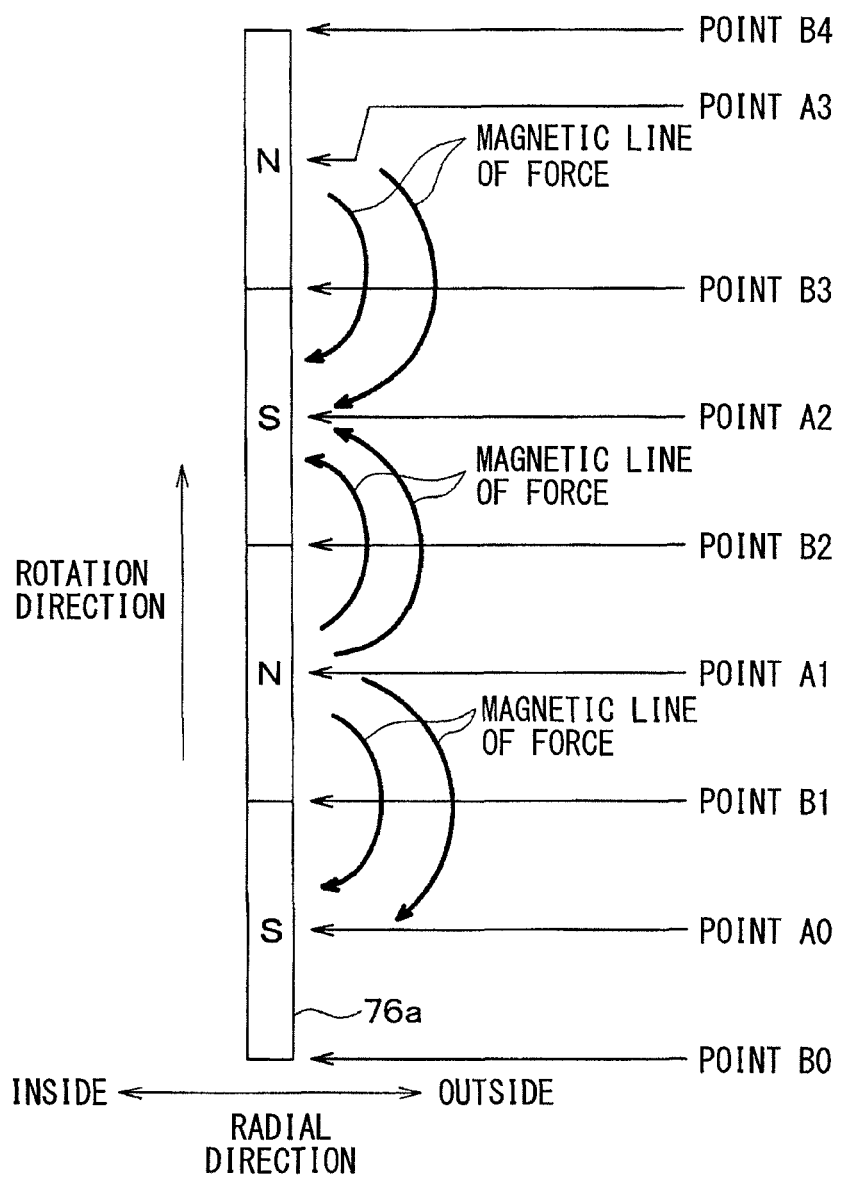
FIG. 11 is a diagram for explaining a configuration of a magnetizing rotor according to the fifth embodiment.

In FIG. 11, for the sake of simplicity of description, the ring-shaped magnets 76a is represented by two S-poles and two N-poles arranged in a straight line (vertical direction in the drawing).

When the magnetizing rotor 76 rotates, direction of magnetic fields (direction of magnetic flux densities) detected by the TMRs 10a, 10b change between immediately before and immediately after the TMRs 10a, 10b face the magnetic pole center (point A1, point A2).

Figure 12:
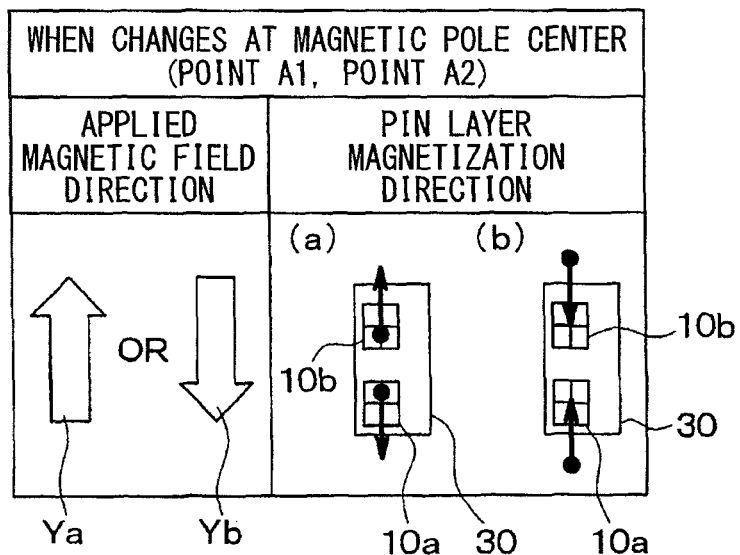
FIG. 12 is a diagram illustrating a direction of a magnetic field applied to a TMR and a direction of magnetization of a pin layer according to the fifth embodiment.

Specifically, when the TMRs 10a, 10b face a region from the center (point A0) of the lower S pole to the center (point A1) of the lower N-pole of the magnet 76a in the drawing, the TMRs 10a, 10b detect the magnetic flux density in the direction Yb (refer to FIG. 12).

Therefore, the TMR 10a detects the magnetic flux density in the same direction as the magnetization direction of its pin layer. In contrast, the TMR 10b detects the magnetic flux density in the opposite direction to the magnetization direction of its pin layer. Accordingly, the resistance of the TMR 10a is larger than the resistance of the TMR 10b, and the resistance of the TMR 10b is smaller than the resistance of the TMR 10a. For example, the resistance of the TMR 10a is the maximum value, and the resistance of the TMR 10b is the minimum value.

Then, when the magnetizing rotor 76 rotates so that the TMRs 10a, 10b can face a region from the center (point A1) of the lower N-pole to the center (point A2) of the upper S-pole of the magnet 76a in the drawing, the TMR 10a detects the magnetic flux density in the opposite direction to the magnetization direction of its pin layer. In contrast, the TMR 10b detects the magnetic flux density in the same direction as the magnetization direction of its pin layer. Accordingly, the resistance of the TMR 10a decreases and becomes smaller than the resistance of the TMR 10b so that the resistance of the TMR 10b can be larger than the resistance of the TMR 10b. For example, the resistance of the TMR 10a becomes the minimum value, and the resistance of the TMR 10b becomes the maximum value.

Then, when the TMRs 10a, 10b face a region from the center (point A2) of the upper S-pole to the center (point A3) of the upper N-pole of the magnet 76a in the drawing, the TMR 10a detects the magnetic flux density in the same direction as the magnetization direction of its pin layer. In contrast, the TMR 10b detects the magnetic flux density in the opposite direction to the magnetization direction of its pin layer. Accordingly, the resistance of the TMR 10a is larger than the resistance of the TMR 10b. The resistance of the TMR 10b is smaller than the resistance of the TMR 10b. For example, the resistance of the TMR 10a becomes the maximum value, and the resistance of the TMR 10b becomes the minimum value.

As described above, according to the present embodiment, each time the magnetizing rotor 76 rotates to a position where the TMRs 10a, 10b face the magnetic pole center (point A1, point A2, and point A3), the directions of the magnetic flux densities detected by the TMRs 10a, 10b change. It is noted that the magnetization directions of the pin layers of the TMRs 10a, 10b are oppose to each other. Therefore, each time the TMRs 10a, 10b face the magnetic pole center (point A1, point A2, and point A3), the resistance of one of the TMRs 10a, 10b becomes larger than the resistance of the other TMR, and the resistance of the other TMR becomes smaller. Thus, the current mirror circuit 43, the voltage output circuit 44, the transistors Try, Tr6, the buffer circuit 47, and the inverter circuit 48 operate in the same manner as described in the first embodiment, so that the sensor signal can be outputted from the common connection terminal 54 between the resistive elements R4, R5. Therefore, the same advantages as those in the first embodiment are obtained.

Other Embodiments

While the present disclosure has been described with reference to embodiments thereof, it is to be understood that the disclosure is not limited to the embodiments. The present disclosure is intended to cover various modifications and equivalent arrangements within the spirit and scope of the present disclosure.

In the fifth embodiment described above, the TMRs 10a, 10b are arranged so that the magnetization direction of the pin layer of the TMR 10a is the direction Yb and that the magnetization direction of the pin layer of the TMR 10b is the direction Ya (refer to (a) of FIG. 12). Alternatively, the TMRs 10a, 10b can be arranged so that the magnetization direction of the pin layer of the TMR 10a is the direction Ya and that the magnetization direction of the pin layer of the TMR 10b is the direction Yb (refer to (b) of FIG. 12).

In the fifth embodiment described above, the TMRs 10a, 10b are arranged so that the magnetization directions of the pin layers of the TMRs 10a, 10b can be orthogonal to the radial direction of the magnetizing rotor 76. Alternatively, the TMRs 10a, 10b can be arranged so that the magnetization directions of the pin layers of the TMRs 10a, 10b can be the radial direction of the magnetizing rotor 76.

Figure 13:
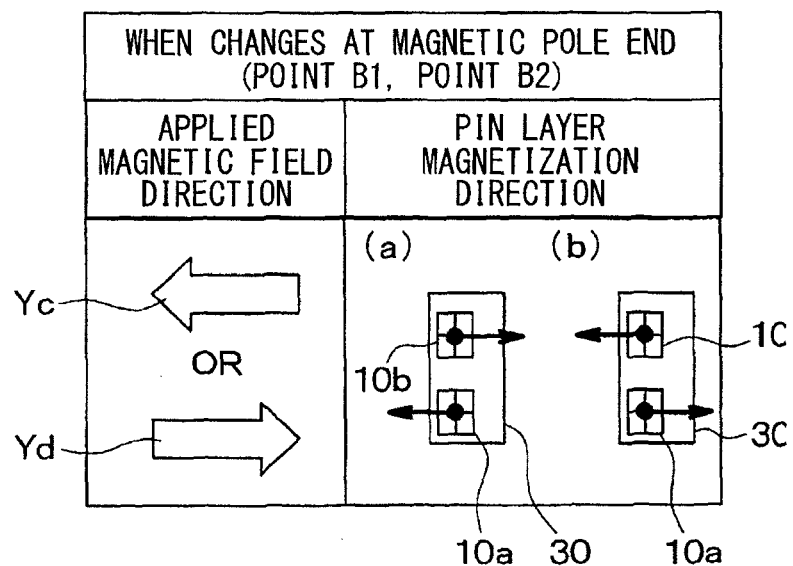
FIG. 13 is a diagram illustrating a direction of a magnetic field applied to the TMR and a direction of magnetization of the pin layer according to a modification of the fifth embodiment.

In this case, for example, the magnetization direction of the pin layer of the TMR 10a is defined as an inner radial direction Yc of the magnetizing rotor 76, and the magnetization direction of the pin layer of the TMR 10b is defined as an outer radial direction Yd of the magnetizing rotor 76 (refer to (a) of FIG. 13).

Then, when the magnetizing rotor 76 rotates, direction of magnetic flux densities (direction of magnetic fields) detected by the TMRs 10a, 10b change immediately after the TMRs 10a, 10b face a magnetic pole end (point B0, point B1, point B2, point B3, point B4) of the magnetizing rotor 76 in FIG. 11.

Specifically, when the TMRs 10a, 10b face the lower S-pole (from point B0 to point B1) of the magnetizing rotor 76 in FIG. 11, the TMRs 10a, 10b detect the magnetic flux density in the inner radial direction Yc (refer to FIG. 13). Therefore, the TMR 10a detects the magnetic flux density in the same direction as the magnetization direction of its pin layer. In contrast, the TMR 10b detects the magnetic flux density in the opposite direction to the magnetization direction of its pin layer. Accordingly, the resistance of the TMR 10a is larger than the resistance of the TMR 10b. The resistance of the TMR 10b is smaller than the resistance of the TMR 10a. For example, the resistance of the TMR 10a is the maximum value, and the resistance of the TMR 10b is the minimum value.

Then, when the magnetizing rotor 76 rotates so that the TMRs 10a, 10b can face the lower N-pole (from point B1 to point B2) of the magnetizing rotor 76 in FIG. 11, the TMRs 10a, 10b detect the magnetic flux density in the outer radial direction Yd (refer to FIG. 13). Therefore, the TMR 10a detects the magnetic flux density in the opposite direction to the magnetization direction of its pin layer. In contrast, the TMR 10b detects the magnetic flux density in the same direction as the magnetization direction of its pin layer. Accordingly, the resistance of the TMR 10a becomes smaller than the resistance of the TMR 10b, and the resistance of the TMR 10b becomes larger than the resistance of the TMR 10b. For example, the resistance of the TMR 10a becomes the minimum value, and the resistance of the TMR 10b becomes the maximum value.

Then, when the magnetizing rotor 76 rotates so that the TMRs 10a, 10b can face the upper S-pole (from point B2 to point B3) of the magnetizing rotor 76 in FIG. 11, the TMRs 10a, 10b detect the magnetic flux density in the inner radial direction Yc (refer to FIG. 13). Therefore, the TMR 10a detects the magnetic flux density in the same direction as the magnetization direction of its pin layer. In contrast, the TMR 10b detects the magnetic flux density in the opposite direction to the magnetization direction of its pin layer. Accordingly, the resistance of the TMR 10a is larger than the resistance of the TMR 10b, and the resistance of the TMR 10b is smaller than the resistance of the TMR 10b. For example, the resistance of the TMR 10a is the maximum value, and the resistance of the TMR 10b becomes the minimum value.

Then, when the magnetizing rotor 76 rotates so that the TMRs 10a, 10b can face the upper N-pole (from point B3 to point B4) of the magnetizing rotor 76 in FIG. 11, the TMRs 10a, 10b detect the magnetic flux density in the outer radial direction Yd (refer to FIG. 13). Therefore, the TMR 10a detects the magnetic flux density in the opposite direction to the magnetization direction of its pin layer. In contrast, the TMR 10b detects the magnetic flux density in the same direction as the magnetization direction of its pin layer. Accordingly, the resistance of the TMR 10a becomes smaller than the resistance of the TMR 10b, and the resistance of the TMR 10b becomes larger than the resistance of the TMR 10b. For example, the resistance of the TMR 10a becomes the minimum value, and the resistance of the TMR 10b becomes the maximum value.

In this way, when the magnetizing rotor 76 rotates, the resistances of the TMRs 10a, 10b repeatedly change in the opposite directions. Therefore, the same advantages as the fifth embodiment are obtained.

In the above, the magnetization direction of the pin layer of the TMR 10a is the inner radial direction Yc of the magnetizing rotor 76, and the magnetization direction of the pin layer of the TMR 10b is the outer radial direction Yd of the magnetizing rotor 76. Alternatively, the magnetization direction of the pin layer of the TMR 10a can be the outer radial direction Yd of the magnetizing rotor 76, and the magnetization direction of the pin layer of the TMR 10b can be the inner radial direction Yd of the magnetizing rotor 76. (refer to (b) of FIG. 13).

Figure 14:
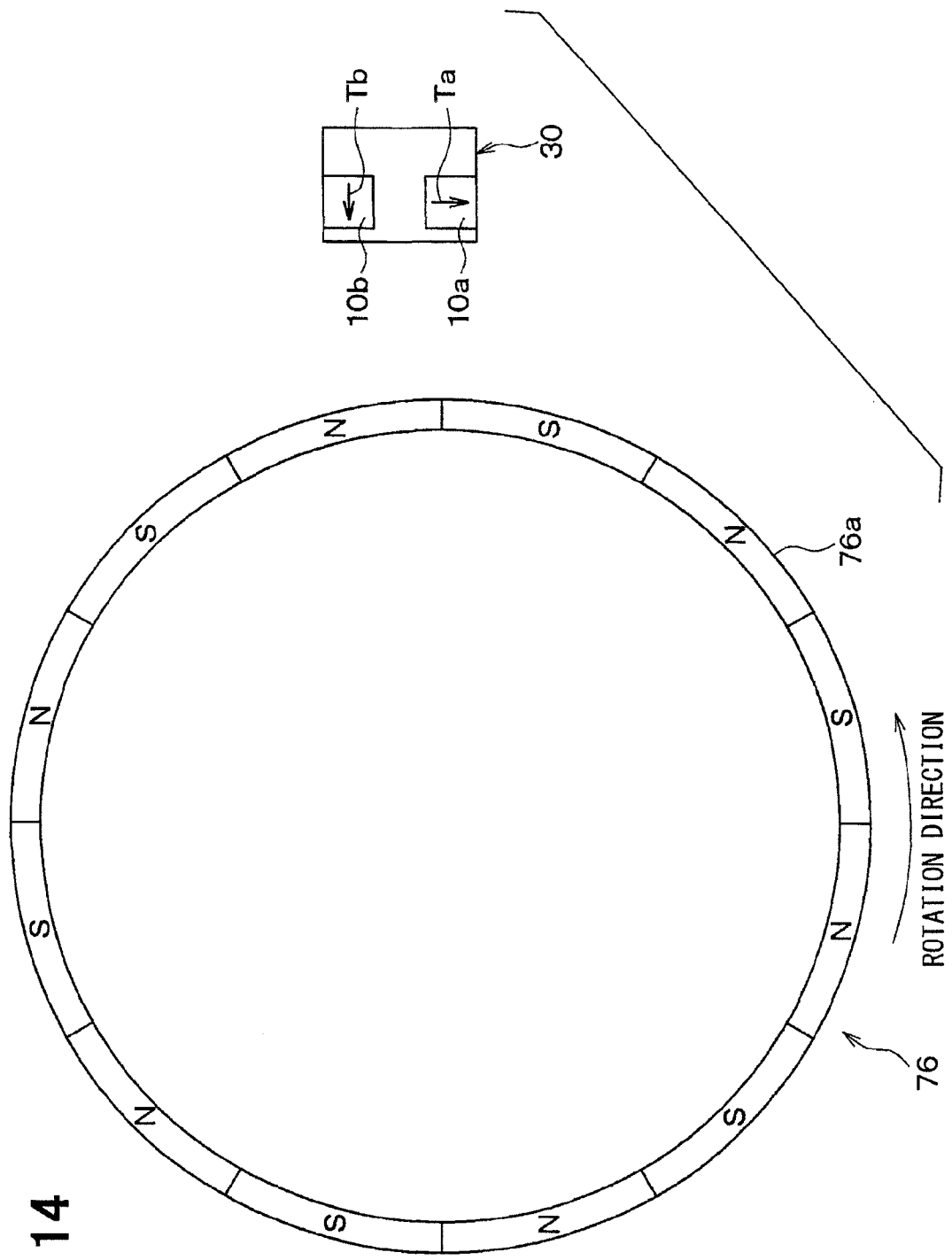
FIG. 14 is a diagram illustrating a direction of magnetization of a pin layer of a TMR according to a modification of the present disclosure.

In the first to fifth embodiments described above, the magnetization directions of the pin layers of the TMRs 10a, 10b are opposite to each other. However, the magnetization directions of the pin layers of the TMRs 10a, 10b are not limited to this but include any directions, as long as they are different from each other and not orthogonal to the magnetizing direction of the bias magnet 20. For example, as illustrated in FIG. 14, the magnetization directions of the pin layers of the TMRs 10a, 10b can be orthogonal to each other.

In the first to fifth embodiments described above, the present disclosure is applied to the rotation detection apparatus 1 configured to detect a rotation of a detection target (10, 76) by using the TMRs 10a, 10b. Alternatively, the present disclosure can be applied to a moving object detection apparatus configured to detect a displacement of a detection target by using the TMRs 10a, 10b.

It is noted that FIG. 11 illustrates the two S-poles and the two N-poles arranged in the vertical direction in the drawing as part of the ring-shaped magnet 76a for the sake of simplicity of description. However, in a case where a moving object including the S-poles and the N-poles arranged alternately in the direction of a straight line as illustrated in FIG. 11 is actually used and displaced in the direction of the straight line (vertical direction in the drawing), the directions of the magnetic flux densities (directions of magnetic fields) detected by the TMRs 10a, 10b change in almost the same manner as the fifth embodiment described above. Therefore, the same advantages as the fifth embodiments are obtained.

In the first to fourth embodiments described above, the N-pole of the bias magnet 20 faces the outer periphery of the spur gear 10. However, the position of the bias magnet 20 relative to the spur gear 10 is not limited to this but includes any position, as long as the resistance of one of the TMRs 10a, 10b becomes larger than the resistance of the other of the TMRs 10a, 10b and the resistance of the other of the TMRs 10a, 10b becomes smaller than the resistance of the one of the TMRs 10a, 10b during rotation of the spur gear 10. The S-pole of the bias magnet 20 can face the outer periphery of the spur gear 10.

In the first to fourth embodiments described above, when the spur gear 10 rotates, the resistance r of the TMRs 10a, 10b changes within the range from the minimum value to the maximum value (minimum value≤r≤maximum value). Alternatively, the resistance r of the TMRs 10a, 10b can change within the range from the minimum value exclusive to the maximum value exclusive (minimum value<r<maximum value).

In the first to fourth embodiments described above, when the spur gear 10 rotates, the 0 mT line A passes the TMRs 10a, 10b. Alternatively, the resistances of the TMRs 10a, 10b can be changed by changing the distribution of magnetic line of force generated from the bias magnet 20 in a range where the 0 mT line A does not pass the TMRs 10a, 10b.

In the first to fourth embodiments described above, the level of the sensor signal outputted from the common connection terminal 54 repeatedly changes with the rotation of the spur gear 10. Alternatively, the level of the sensor signal can change with the rotation of the spur gear 10 only once from one of a high-level and a low-level to the other of a high-level and a low-level.

In the first to fourth embodiments described above, field effect transistors including pMOS transistors and nMOS transistors are used as the transistors Tr1-Tr6. Alternatively, bipolar transistors can be used as the transistors Tr1-Tr6.

In the first to fourth embodiments described above, the zener diode 41 is used as an overvoltage protection element in the rotation detection apparatus 1. Alternatively, it is not always necessary that an overvoltage protection element is used in the rotation detection apparatus 1.

In the first to the fifth embodiments described above, a TMR (tunnel magnetoresistive element) is used as a magnetoresistive element having a pin layer. Alternatively, a GMR (giant magnetoresistive element) can be used.

What is claimed is:

1. A moving object detection apparatus comprising:
   a current mirror circuit including first and second transistors connected in parallel between a power source and a ground, the first and second transistors having gates connected to a ground-side terminal of the first transistor;
   a first magnetoresistive element having a pin layer and located between the first transistor and the ground;
   a second magnetoresistive element having a pin layer and located between the second transistor and the ground;
   a constant voltage circuit configured to output a constant voltage;
   a voltage output circuit including a third transistor located between the first transistor and the first magnetoresistive element and a fourth transistor located between the second transistor and the second magnetoresistive element, the voltage output circuit configured to respectively apply constant voltages to the first and second magnetoresistive elements based on an output voltage of the constant voltage circuit, when the output voltage of the constant voltage circuit is applied to gates of the third and fourth transistors, and
   a fifth transistor located between the second and fourth transistors and configured to operate in accordance with a potential of a power-source-side terminal of the fourth transistor, wherein
   the first and second magnetoresistive elements are arranged so that magnetization directions of the pin layers are different from each other,
   each of the first and second magnetoresistive elements has a resistance changing with a change in a component of a magnetic flux density, which is generated from a bias magnet, in the magnetization direction of the pin layer,
   in a case where the magnetic flux densities detected by the first and second magnetoresistive elements change with a movement of a detection target made from a magnetic material, when the resistance of the first magnetoresistive element becomes larger than the resistance of the second magnetoresistive element, a first current flowing from the power source to the first magnetoresistive element becomes smaller than a second current flowing from the power source to the second magnetoresistive element, the second transistor reduces the second current according to a decrease in the first current, and the resistance of the second magnetoresistive element becomes smaller than the resistance of the first magnetoresistive element, the fifth transistor increases the second current according to a decrease in the resistance of the second magnetoresistive element to reduce a signal level outputted from a common connection terminal between a power-source-side terminal of the fifth transistor and a ground-side terminal of the second transistor, and
   in the case, when the resistance of the first magnetoresistive element becomes smaller than the resistance of the second magnetoresistive element, the first current becomes larger than the second current, the second transistor increases the second current according to an increase in the first current, and the resistance of the second magnetoresistive element becomes larger than the resistance of the first magnetoresistive element, the fifth transistor reduces the second current according to an increase in the resistance of the second magnetoresistive element to increase the signal level outputted from the common connection terminal between the second and fifth transistors.

2. The moving object detection apparatus according to claim 1, wherein
   when the detection target moves, a first state and a second state are repeatedly alternated,
   in the first state, the resistance of the first magnetoresistive element becomes larger than the resistance of the second magnetoresistive element, and the resistance of the second magnetoresistive element becomes smaller than the resistance of the first magnetoresistive element, and
   in the second state, the resistance of the first magnetoresistive element becomes smaller than the resistance of the second magnetoresistive element, and the resistance of the second magnetoresistive element becomes larger than the resistance of the first magnetoresistive element.

3. The moving object detection apparatus according to claim 2, wherein
   when the detection target moves, a zero magnetic flux density portion where the magnetic flux density generated from the bias magnet is zero passes the first and second magnetoresistive elements repeatedly so that the first state and the second state are repeatedly alternated.

4. The moving object detection apparatus according to claim 1, further comprising:
   a variable resistive element having a controllable resistance and connected in parallel to the first magnetoresistive element between the third transistor and the ground, and
   a control circuit configured to control the resistance of the variable resistive element in accordance with the signal outputted from the common connection terminal between the second and fifth transistors in such a manner that a change in the current flowing from the power source to the first and third transistors exhibits hysteresis with respect to a change in the magnetic flux density detected by the first magnetoresistive element.

5. The moving object detection apparatus according to claim 1, further comprising:
   a first resistive element connected in parallel to the first magnetoresistive element between the third transistor and the ground; and
   a second resistive element connected in parallel to the second magnetoresistive element between the fourth transistor and the ground, wherein
   the resistances of the first and second resistive elements are set so that a characteristic indicating a relationship between a combined resistance of the first magnetoresistive element and the first resistive element and the magnetic flux density of the first magnetoresistive element becomes opposite to a characteristic indicating a relationship between a combined resistance of the second magnetoresistive element and the second resistive element and the magnetic flux density of the second magnetoresistive element.

6. The moving object detection apparatus according to claim 1, wherein
each of the first and second magnetoresistive elements is a tunnel magnetoresistive element.

7. The moving object detection apparatus according to claim 1, wherein
the first and second magnetoresistive elements are arranged in such a manner that the magnetization directions of the pin layers are opposite to each other.

8. The moving object detection apparatus according to claim 7, wherein
the first and second magnetoresistive elements are arranged in such a manner that the magnetization directions of the pin layers are parallel to a direction connecting a S-pole and a N-pole of the bias magnet.

9. The moving object detection apparatus according to claim 1, wherein
the first and second magnetoresistive elements are arranged in such a manner that the magnetization directions of the pin layers are orthogonal to each other.

* * * * *